(12) United States Patent
Kanamitsu et al.

(10) Patent No.: US 6,999,348 B2
(45) Date of Patent: Feb. 14, 2006

(54) NONVOLATILE SEMICONDUCTOR STORAGE UNIT

(75) Inventors: Michitaro Kanamitsu, Ome (JP); Yoshinori Takase, Tokyo (JP); Shoji Kubono, Ome (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/501,391

(22) PCT Filed: Feb. 28, 2002

(86) PCT No.: PCT/JP02/01846

§ 371 (c)(1),
(2), (4) Date: Jul. 15, 2004

(87) PCT Pub. No.: WO03/073432

PCT Pub. Date: Sep. 4, 2003

(65) Prior Publication Data

US 2005/0047212 A1    Mar. 3, 2005

(51) Int. Cl.
*G11C 11/34* (2006.01)
(52) U.S. Cl. .................. 365/185.25; 365/203
(58) Field of Classification Search .......... 365/185.25, 365/203
See application file for complete search history.

(56) References Cited

U.S. PATENT DOCUMENTS 6,026,014 A  *  2/2000  Sato et al. ............. 365/185.03
6,525,960 B2 *  2/2003  Yoshida et al. ........ 365/185.03

FOREIGN PATENT DOCUMENTS

JP      7-307098     11/1995
JP     10-188576      7/1998
JP     11-250681      9/1999

OTHER PUBLICATIONS

K. Imamiya et al., "MP6.6 A 130 mm² 256 Mb NAND Flash with Shallow Trench Isolation Technology", *1999 IEEE International Solid-State Circuits Conference*.
K. Suh et al., "TA7.5: A 3.3V 32 Mb NAND Flash Memory with Incremental Step Pulse Programming Scheme", *1995 IEEE International Solid-State Circuits Conference*, pp. 128-129.
K. Imamiya et al., "TA7.6: A 35 ns-Cycle-Time 3.3V-Only 32 Mb NAND Flash EEPROM", *1995 IEEE International Solid-State Circuits Conference*, pp. 130-131.

* cited by examiner

*Primary Examiner*—Michael Tran
(74) *Attorney, Agent, or Firm*—Miles & Stockbridge P.C.

(57) ABSTRACT

A nonvolatile semiconductor storage unit can prevent erratic sense operations in a sense latch circuit by adopting a single-end sensing system capable of reducing an area (decreasing the number of elements). There is provided a flash memory chip using the single-end sensing system and an NMOS gate sensing system together. In the single-end sensing system, the sense latch circuit is connected to one end of a global bit line to detect data on the global bit line corresponding to a threshold voltage for a memory cell. The NMOS gate sensing system uses an NMOSFET to receive data on the global bit line at a gate and drive a node for the sense latch circuit. The NMOSFET senses a sense voltage. The sense latch circuit is activated with a sufficient signal quantity ensured. An output voltage from a threshold voltage applying power supply precharges the global bit line. In this manner, it is possible to always keep a constant difference between a precharge voltage and a threshold voltage for the NMOSFET.

13 Claims, 10 Drawing Sheets

NONVOLATILE SEMICONDUCTOR STORAGE UNIT

BACKGROUND OF THE INVENTION

The present invention relates to a semiconductor storage unit. More specifically, the present invention concerns a technology effectively applied to a nonvolatile semiconductor storage unit such as flash memory using a technology called a single-end sensing system, i.e., a technique which provides a sense latch circuit at one end of a bit line and uses the sense latch circuit to detect voltages on the bit line corresponding to a threshold voltage of a memory cell.

According to the inventors' investigation, the following technology is available for the flash memory as an example of the nonvolatile semiconductor storage unit.

For example, the flash memory uses a memory cell that comprises a nonvolatile storage element having a control gate and a floating gate. One transistor can constitute a memory cell. Such flash memory adopts a so-called "multivalued" flash memory concept to store two bits or more of data in one memory cell for increasing the storage capacity. The multivalued flash memory controls the amount of electric charge supplied to the floating gate to gradually change a threshold voltage. It is possible to store a plurality of bits of information corresponding to each threshold voltage.

The above-mentioned flash memory increases its chip size as the storage capacity increases. It is also necessary to prevent the chip size from increasing. In consideration for the chip size, for example, there are many restrictions on an area of a memory array comprising a plurality of memory cells displaced at intersecting points between word lines and bit lines in a matrix. A particular attention needs to be placed on an area of a Y access circuit and the like in the memory array. The Y access circuit for the flash memory is configured using technologies called the open bit sensing system and the single-end sensing system, for example.

The following documents are examples that describe technologies concerning the flash memory using the single-end sensing system.

1999 IEEE International Solid-State Circuits Conference, MP6.6:A130 mm² 256 Mb NAND Flash with Shallow Trench Isolation Technology 1995 IEEE International Solid-State Circuits Conference, TA7.5:A3.3V32 Mb NAND Flash Memory with Incremental Step Pulse Programming Scheme 1995 IEEE International Solid-State Circuits Conference, TA7.6:A 35 ns-Cycle-Time 3.3V-Only 32 Mb NAND Flash EEPROM The following is made clear after the inventors examined the technologies using the open bit sensing system and the single-end sensing system concerning the Y access circuit for the flash memory as mentioned above.

Figure 9:
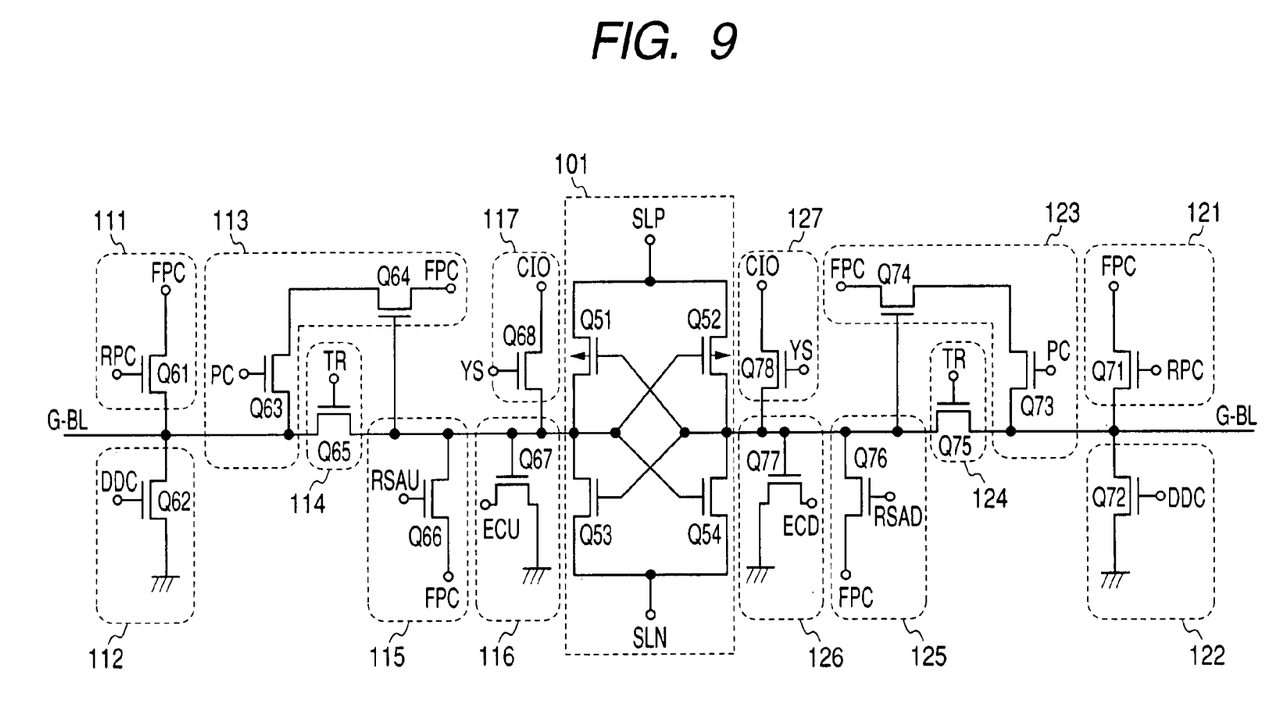
FIG. 9 is a circuit diagram showing a Y access circuit according to an open bit sensing system as the first presupposed technology for the present invention.
Figure 10:
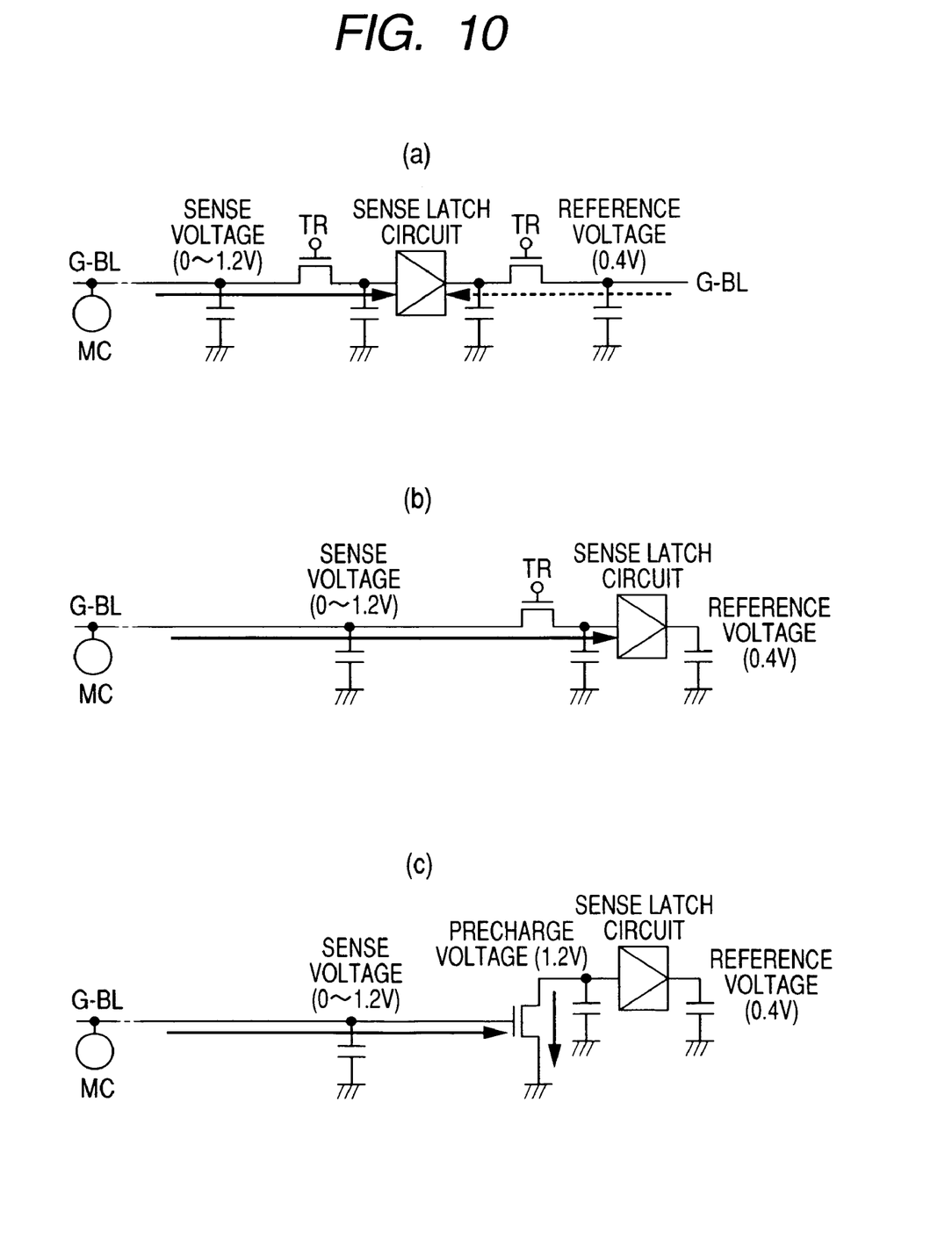

The open bit sensing system is configured to connect two global bit lines to both ends of the sense latch circuit. As a first presupposed technology of the present invention, the open bit sensing system will be described with reference to a circuit diagram in FIG. 9 showing a Y access circuit. In addition, FIG. 10 is used to describe sense operations of the open bit sensing system (a) and the single-end sensing system (b) as a second presupposed technology of the present invention.

As shown in FIG. 9, the Y access circuit in the open bit sensing system comprises a sense latch circuit 101 and the other circuits in pairs connected to a global bit line G-BL extending from both ends of the sense latch circuit 101. The circuits in pairs include: global bit line precharge circuits 111 and 121; global bit line discharge circuits 112 and 122; global bit line selective precharge circuits 113 and 123; transfer circuits 114 and 124; sense latch node control circuits 115 and 125; all-determination circuits 116 and 126; and Y-selection switch circuits 117 and 127.

The sense latch circuit 101 comprises PMOSFETs Q51 and Q52 and NMOSFETs Q53 and Q54. The sense latch circuit 101 senses a threshold state of the memory cell and latches data after the sense operation.

The global bit line precharge circuits 111 and 121 comprise NMOSFETs Q61 and Q71 and precharge the global bit line G-BL at a time.

The global bit line discharge circuits 112 and 122 comprise NMOSFETs Q62 and Q72 and discharge the global bit line G-BL at a time.

The global bit line selective precharge circuits 113 and 123 comprise NMOSFETs Q63, Q64, Q73, and Q74 and selectively precharge the global bit line G-BL based on a given unit.

The transfer circuits 114 and 124 comprise NMOSFETs Q65 and Q75 and make connection or disconnection between the sense latch circuit 101 and the global bit line G-BL.

The sense latch node control circuits 115 and 125 comprise NMOSFETs Q66 and Q76 and charge or discharge nodes in the sense latch circuit 101.

The all-determination circuits 116 and 126 comprise NMOSFETs Q67 and Q77 and determine latch data in the sense latch circuit 101.

The Y-selection switch circuits 117 and 127 comprise NMOSFETs Q68 and Q78 and function as switches to input and output data between the sense latch circuit 101 and a common input/output line.

When the open bit sensing system is used as shown in FIG. 10(a), the memory cell MC is connected to one global bit line G-BL (left). The global bit line G-BL is set to a voltage corresponding to the memory threshold voltage. A reference voltage is applied to the other global bit line G-BL (right) The open bit sensing system uses a relatively large capacity for the global bit line G-BL. Both global bit lines G-BL use almost the same capacity, enabling stable sense operations.

On the other hand, the single-end sensing system is configured to lay out the sense latch circuit at one end of the global bit line G-BL. The single-end sensing system aims at reducing the area, i.e., decreasing the number of elements. When the single-end sensing system is used as shown in FIG. 10(b), only one side of the sense latch circuit is connected to the global bit line G-BL. The capacity of the reference side decreases approximately one sixth of that of the sense side. The single-end sensing system performs sense operations with a large capacity difference between both sides of the sense latch circuit, causing a problem of miss sensing.

The above-mentioned open bit sensing system uses many elements for supplementary circuits to control two global bit lines G-BL, facing a problem of reducing the layout area by decreasing the number of elements. For example, the above-mentioned Y access circuit in FIG. 9 requires:

4 elements for the sense latch circuit 101;

1×2=2 elements for the global bit line precharge circuits 111 and 121;

1×2=2 elements for the global bit line discharge circuits 112 and 122;

2×2=4 elements for the global bit line selective precharge circuits 113 and 123;

1×2=2 elements for the transfer circuits 114 and 124;

1×2=2 elements for the sense latch node control circuits 115 and 125;

1×2=2 elements for the all-determination circuits 116 and 126; and

1×2=2 elements for the Y-selection switch circuits 117 and 127.

It is therefore an object of the present invention to provide a nonvolatile semiconductor storage unit capable of preventing erratic sense operations in a sense latch circuit by using the single-end sensing system capable of reducing an area (decreasing the number of elements).

SUMMARY OF THE INVENTION

These and other objects and novel features of the invention may be readily ascertained by referring to the following description and appended drawings.

The following summarizes representative aspects of the invention disclosed in this application.

In order to achieve the above-mentioned object, the nonvolatile semiconductor storage unit according to the present invention is characterized as follows.

(1) There is provided a flash memory chip using a single-end sensing system and a so-called NMOS gate sensing system together. In the single-end sensing system, a sense latch circuit is connected to one end of a global bit line to detect data on the global bit line corresponding to a threshold voltage for a memory cell. The NMOS gate sensing system uses an NMOSFET connected between the bit line and the sense latch circuit to receive data on the global bit line at a gate node of the NMOSFET and drive a node for the sense latch circuit. The flash memory has a bit line precharge circuit and a power supply circuit. The bit line precharge circuit is connected to the bit line and precharges it. The power supply circuit is connected to the bit line precharge circuit and generates a precharge voltage for the bit line dependently of a threshold voltage for the NMOSFET.

The technology using the single-end sensing system and the NMOS gate sensing system is characterized as follows. A sense operation may malfunction if only the sense latch circuit is used in the single-end sensing system based on the above-mentioned second presupposed technology for the present invention. To solve this problem, the single-end sensing system is changed to the NMOS gate sensing system which is configured by connecting the global bit line G-BL at the sensing side to the NMOSFET gate as shown in FIG. 10(*c*).

Further, the above-mentioned NMOS gate sensing system needs to always keep constant the difference between a precharge voltage on the global bit line G-BL and a threshold voltage for the NMOSFET. The threshold voltage fluctuates and does not become constant due to process variations. To solve this problem, a threshold voltage dependent voltage is used to keep the voltage difference constant even when the threshold voltage fluctuates.

(2) In the flash memory according to the above-mentioned aspect (1), the bit line precharge circuit can supply first and second potentials with different voltage values and further comprises a function to discharge the bit line. The bit line precharge circuit is supplied with the first potential when precharging the bitline. The bit line precharge circuit is supplied with the second potential when discharging the bit line. In this manner, the global bit line discharge circuit is eliminated.

(3) The flash memory according to the above-mentioned aspect (2) further comprises a bit line selective precharge circuit which is connected to the bit line and selectively precharges the bit line. The bit line selective precharge circuit can supply third and fourth potentials with different voltage values and further comprises a function to determine data in the sense latch circuit in cooperation with the bit line precharge circuit. When selectively precharging the bit line, the bit line selective precharge circuit supplies the third potential to the bit line selective precharge circuit. When determining data in the sense latch circuit, the bit line selective precharge circuit is supplied with the forth potential and the bit line precharge circuit is supplied with the second potential. In this manner, the all-determination circuit is eliminated.

(4) The flash memory according to the above-mentioned aspect (1) further comprises a selection circuit which is connected to a node of the sense latch circuit and interchanges data between the sense latch circuit and a common input/output line. The selection circuit can supply fifth and sixth potentials with different voltage values and further comprises a function to precharge and discharge the node for the sense latch circuit. The selection circuit makes connection between the sense latch circuit and the common input/output line when data is exchanged therebetween. The selection circuit is supplied with the fifth potential when a node for the sense latch circuit is precharged. The selection circuit is supplied with the sixth potential when the node for the sense latch circuit is discharged. In this manner, the sense latch node control circuit is eliminated.

BRIEF DESCRIPTION OF THE DRAWINGS

FIGS. 5(*a*) and 5(*b*) are characteristics diagrams for comparison between a second presupposed technology of the present invention and the technology according to the present invention;

FIGS. 6(*a*) and 6(*b*) are circuit diagrams showing a global bit line precharge/discharge circuit for comparison between a first presupposed technology for the present invention and the technology according to the present invention;

FIGS. 7(*a*) and 7(*b*) are circuit diagrams showing a global bit line selection precharge/all-determination circuit;

FIGS. 8(*a*) and 8(*b*) are circuit diagrams showing a Y-selection switch/sense latch node control circuit;

FIGS. 10(*a*), 10(*b*), and 10(*c*) are explanatory diagrams showing sense operations of the open bit sensing system, the single-end sensing system, and the NMOS gate sensing system for comparison between the first or second presupposed technology for the present invention and the technology according to the present invention.

DETAILED DESCRIPTION OF THE PREFERRED EMBODIMENTS

Embodiments of the present invention will be described in further detail with reference to the accompanying drawings. In all drawings for describing the embodiments, the same parts or components are depicted by the same reference numerals and a detailed description is omitted for simplicity.

Figure 1:
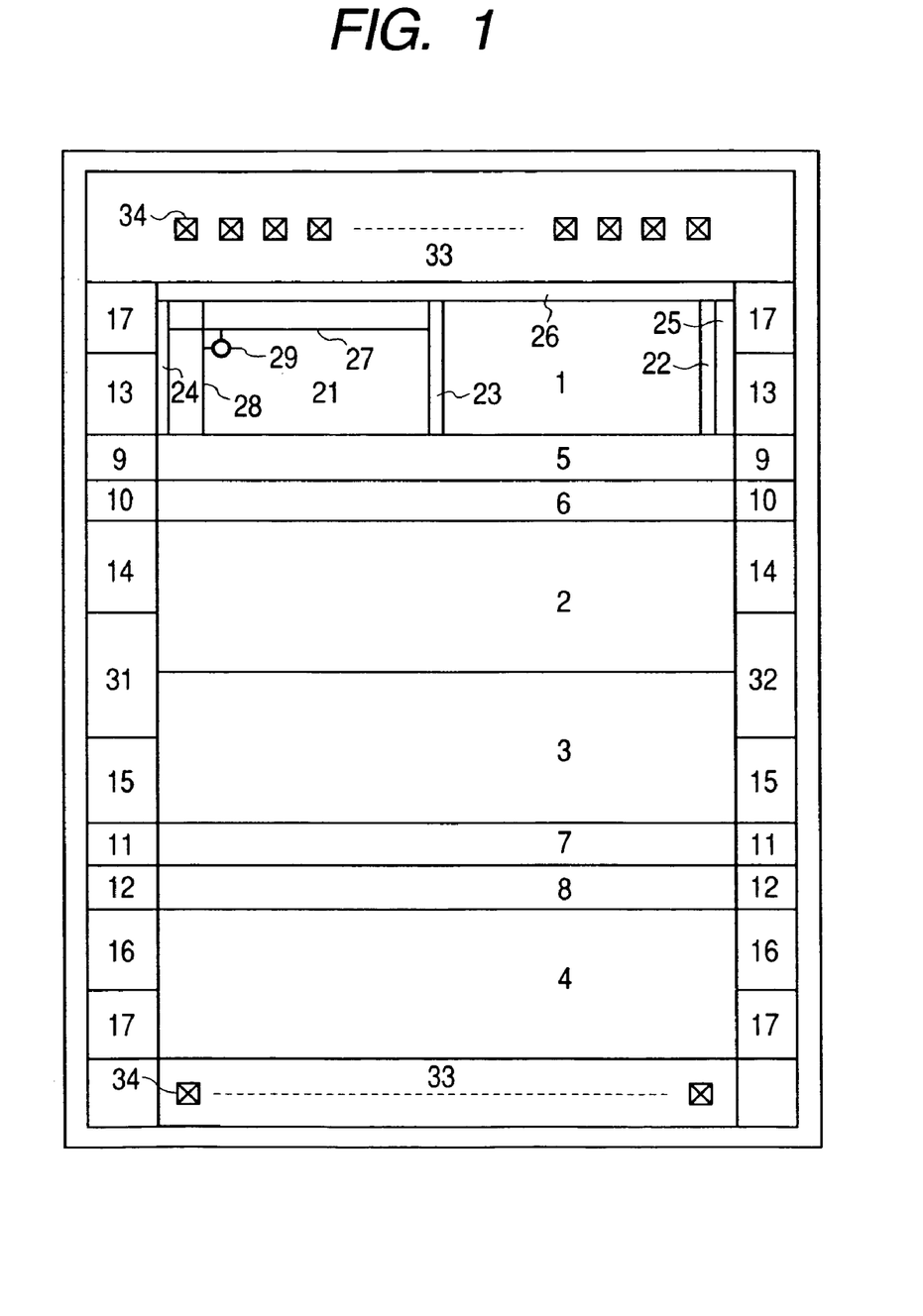
FIG. 1 is a schematic configuration diagram showing flash memory as an embodiment of the nonvolatile semiconductor storage unit according to the present invention.

FIG. 1 is a schematic configuration diagram showing flash memory as an embodiment of the nonvolatile semiconductor storage unit according to the present invention.

Though not particularly specified, the flash memory according to the embodiment comprises a plurality of banks capable of operating individually, for example. Each memory cell can store a plurality of bits of data as threshold voltages. The flash memory comprises four banks 1 through 4, sense latch sets 5 through 8 corresponding to the banks 1 through 4, Y-axis control circuits 9 through 12, SRAMs 13 through 16, and an indirect periphery circuit 17. Circuit elements constituting each circuit are fabricated on one semiconductor substrate such as single crystal silicon based on known manufacturing technologies for semiconductor integrated circuits.

Each of the banks 1 through 4 comprises a memory array 21, three sub-decoders 22 through 24, a main decoder 25, and one gate decoder 26. The sub-decoders 22 through 24 are disposed at the center and outsides of the memory array along the Y direction (word line direction). The main decoder 25 is disposed outside the sub-decoder 22. The gate decoder 26 is disposed outside the X direction (bit line direction) of the memory array 21. As will be described in more detail later, the memory array 21 is connected to a plurality of word lines 27 and a plurality of bit lines 28. The memory array 21 comprises a plurality of memory sets further comprising a plurality of parallel connected memory cells 29 each having a control gate and a floating gate. According to a decode result, the sub-decoders 22 through 24, the main decoder 25, and the gate decoder 26 use one word line 27 connected to any memory cell 29 in each memory array 21 as a selection level.

The sense latch sets 5 through 8 are disposed adjacently to the banks 1 through 4. The sense latch sets 5 and 6 are sandwiched between the banks 1 and 2. The sense latch sets 7 and 8 are sandwiched between the banks 3 and 4. The sense latch sets 5 through 8 use the single-end sensing system (NMOS gate sensing) to be described in more detail later. The sense latch sets 5 through 8 detect a level of the bit line 28 during reading and supply an electric potential corresponding to write data during writing. The Y-axis control circuits 9 through 12 are disposed adjacently to the sense latch sets 5 through 8 at peripheries of the chip. The Y-axis control circuits 9 through 12 control the sense latch set and transfer write data and read data. The SRAMs 13 through 16 are disposed adjacently to the Y-axis control circuits 9 through 12 at peripheries of the chip. The SRAMs 13 through 16 store the write data and read data.

The indirect periphery circuit 17 is disposed at a periphery of the chip. The indirect periphery circuit 17 includes a control circuit 31, a power supply circuit 32, and an input/output circuit 33. The control circuit 31 controls erase, write, and read operations. The power supply circuit 32 generates various voltages needed for operations. The input/output circuit 33 is externally supplied with address signals, write data, commands, control signals, and the like, and outputs read data. The input/output circuit 33 is disposed outside the X direction at a periphery of the chip and is provided with a plurality of pads 34 used as external terminals for connection to the outside.

Figure 2:
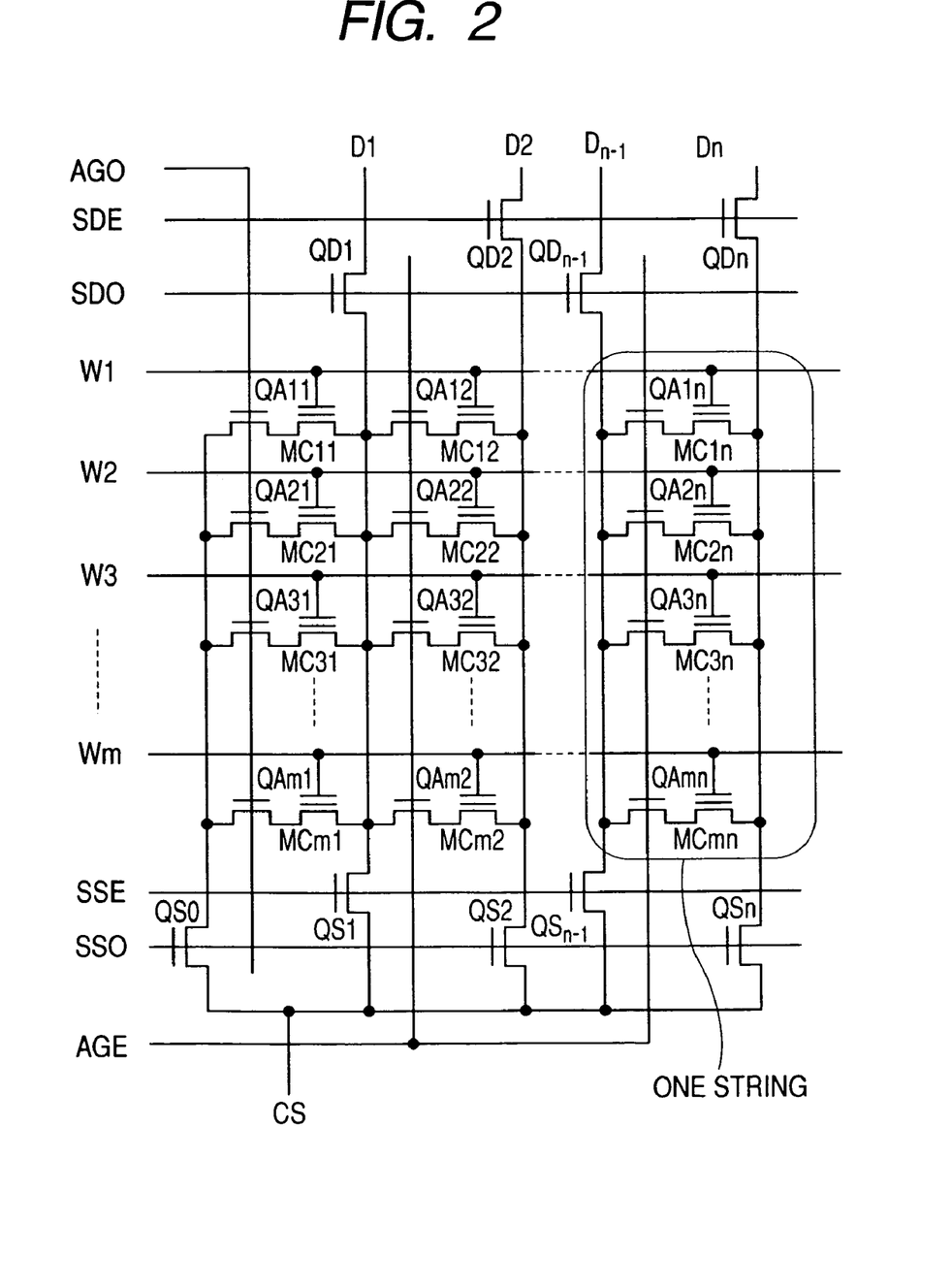
FIG. 2 is a circuit diagram showing a main part of a memory array in the flash memory according to the embodiment of the present invention.

FIG. 2 shows an example of the memory array configuration of the flash memory according to the embodiment. Though not particularly specified, the memory array in the flash memory according to the embodiment complies with a so-called AG-AND type of configuration as the example here. Further, the embodiment is also applicable to various memory array configurations such as AND and NAND types. Of course, the embodiment is also applicable to flash memories capable of storing multivalued data. In such flash memories, each memory cell stores 2-value or 4-value data by setting a threshold voltage to two or four levels. Moreover, the threshold voltage can be set to three or five or more to store multivalued data.

FIG. 2 shows one block of the memory array. The block comprises part of banks and uses a set comprising a plurality of strings as a unit. Each string uses, as a unit, a set comprising a plurality of memory cells in the memory set connected to the bit line.

One block of memory array comprises a plurality of strings parallel disposed along the word line direction. One string is parallel connected to a plurality of memory cells along the bit line direction. In this example, one block comprises m word lines W1 through Wm, n bit lines D1 through Dn, n strings, and m by n memory cells MC11 through MCmn. That is to say, there are disposed m memory cells per string.

For example, the memory set comprises m memory cells MC11 through MCm1 per string. Each gate of the memory cells MC11 through MCm1 is connected to each of word lines W1 through Wm. Each drain is connected commonly. The memory set is connected to the bit line D1 via a drain selection MOSFET QD1 that is driven by a signal on a drain control signal line SDO. In addition, the memory set is connected to a common source line CS via a source selection MOSFET QS1 that is driven by a signal on a source control signal line SSE. The sources of the memory set are connected commonly to each other via MOSFETs QA11 through QAm1 that are driven by a signal on a gate control signal line AGO. The sources are connected to the common source line CS via a source selection MOSFET QS0 that is driven by a signal on a source control signal line SSO.

Another memory set adjacent to the above-mentioned memory set comprises memory cells MC12 through MCm2. Each gate of the memory cells MC12 through MCm2 is connected to each of word lines W1 through Wm. Each drain is connected commonly. The memory set is connected to the bit line D2 via a drain selection MOSFET QD2 that is driven by a signal on a drain control signal line SDE. In addition, the memory set is connected to a common source line CS via a source selection MOSFET QS2 that is driven by a signal on a source control signal line SSO. The sources of the memory set are connected commonly to each other via MOSFETs QA12 through QAm2 that are driven by a signal on a gate control signal line AGE. The sources are connected to a bit line D1 via the drain selection MOSFET QD1 that is driven by a signal on the drain control signal line SDO. The sources are connected to the common source line CS via the source selection MOSFET QS1 that is driven by a signal on a source control signal line SSE.

The memory sets at odd-numbered columns are correspondingly connected to the word lines W and the bit lines D in the same manneras the above-mentioned memory set comprising the memory cells MC11 through MCm1. The memory sets are connected so as to be driven by signals on the drain control signal line SDO, the source control signal line SSE, the gate control signal line AGO, and the source control signal line SSO. The memory sets at even-numbered columns are correspondingly connected to the word lines W and the bit lines D in the same manner as the above-mentioned memory set comprising the memory cells MC12 through MCm2. The memory sets are connected so as to be driven by signals on the drain control signal line SDE, the source control signal line SSO, the gate control signal line AGE, the drain control signal line SDO, and the source control signal line SSE.

In this memory array configuration, the word lines W1 through Wm are connected to the sub-decoder and the main decoder. One word line W is selected from each memory array according to decode results of the sub-decoder and the main decoder. The selected word line W is supplied with predetermined voltages corresponding to operations of erasing, writing, and reading data. During erase, write, and read operations, predetermined voltages are supplied to not only the word line W, but also the other signal lines such as the bit line D, the drain control signal lines SDO and SDE, the source control signal lines SSE and SSO, and the gate control signal lines AGO and AGE. In this manner, predetermined voltages are supplied to the source and the drain of the memory cell MC.

Figure 3:
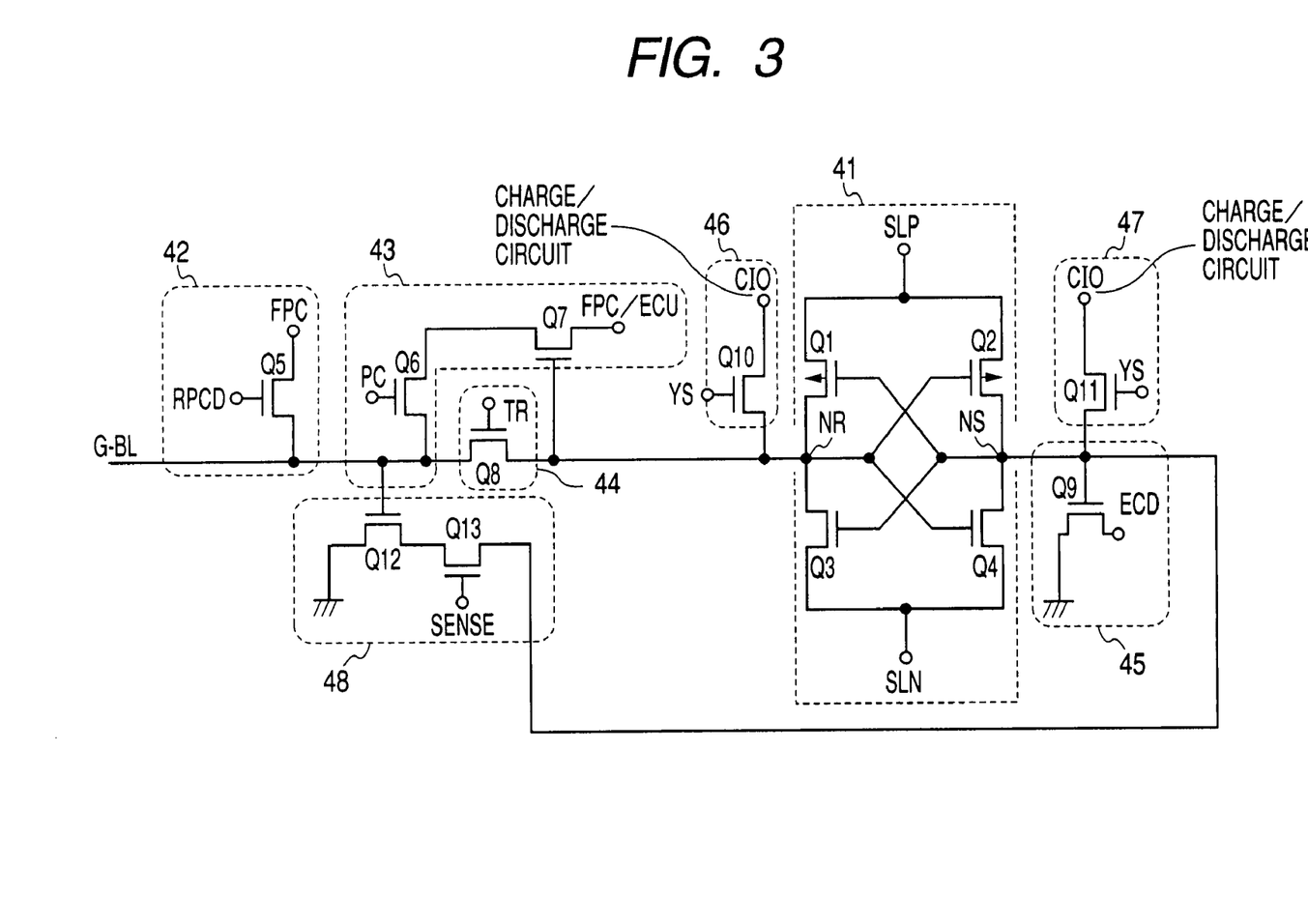
FIG. 3 is a circuit diagram showing a Y access circuit according to a single-end sensing system (NMOS gate sensing)

With reference to FIG. 3, the following describes an example of the Y access circuit based on the single-end sensing system (NMOS gate sensing) in the flash memory according to the embodiment.

As shown in FIG. 3, the Y access circuit according to the single-end sensing system (NMOS gate sensing) comprises a sense latch circuit 41 connected to the global bit line. The Y access circuit further comprises the following circuits connected to the global bit line: a global bit line precharge/discharge circuit 42, a global bit line selection precharge/all-determination circuit 43, a transfer circuit 44, an all-determination circuit 45, a Y-selection switch/sense latch node control circuits 46 and 47, and an NMOS gate sensing circuit 48. The global bit line G-BL connected to the sense latch circuit 41 corresponds to the above-mentioned bit line in FIG. 2.

The sense latch circuit 41 senses a threshold state of the memory cell and latches the sensed data. The sense latch circuit 41 comprises two PMOSFETs Q1 and Q2 and two NMOSFETs Q3 and Q4 to configure a CMOS structured latch type (gate-drain crossing type) circuit scheme. High potential sides of the PMOSFETs Q1 and Q2 are connected to a signal line SLP. Low potential sides of the NMOSFETs Q3 and Q4 are connected to a signal line SLN.

The global bit line precharge/discharge circuit 42 has a function to precharge the global bit line G-BL at a time and a function to discharge the global bit line G-BL at a time. The global bit line precharge/discharge circuit 42 comprises one NMOSFET Q5 and is connected between the global bit line G-BL and a signal line FPC. The gate is connected to a signal line RPCD so as to be driven.

The global bit line selection precharge/all-determination circuit 43 has a function to perform selective precharge in units of global bit lines G-BL and a function to perform all determination of latch data for the sense latch circuit 41. The global bit line selection precharge/all-determination circuit 43 comprises two NMOSFETs Q6 and Q7 connected to each other and is connected between the global bit line G-BL and a signal line FPC/ECU. The gate of the NMOSFET Q6 is connected to a signal line PC so as to be driven. The gate of the NMOSFET Q7 is connected to the global bit line G-BL so as to be driven.

The transfer circuit 44 makes connection or disconnection between the sense latch circuit 41 and the global bit line G-BL. The transfer circuit 44 comprises one NMOSFET Q8 and is connected between the global bit line G-BL and one node NR (global bit line G-BL side) of the sense latch circuit 41. The gate is connected to a signal line TR so as to be driven.

The all-determination circuit 45 performs all determination of latch data for the sense latch circuit 41. The all-determination circuit 45 comprises one NMOSFET Q9 and is connected between a signal line ECD and the ground potential. The gate is connected to the other node NR (opposite the global bit line G-BL) of the sense latch circuit 41 so as to be driven.

The Y-selection switch/sense latch node control circuits 46 and 47 have two functions. One is a switch function to input or output data between the sense latch circuit 41 and a common input/output line CIO. The other function is to charge or discharge a node for the sense latch circuit 41. The Y-selection switch/sense latch node control circuits 46 and 47 comprise two NMOSFETs Q10 and Q11 connected to the nodes NR and NS at both sides of the sense latch circuit 41. For example, the NMOSFET Q10 functions as a reference side and is connected between one node NR of the sense latch circuit 41 and the common input/output line CIO. The gate is connected to a signal line YS so as to be driven. For example, the NMOSFET Q11 functions as a sense side and is connected between the other node NS of the sense latch circuit 41 and the common input/output line CIO. The gate is connected to the signal line YS so as to be driven.

The NMOS gate sensing circuit 48 has two functions. One is to perform a sense operation. The other is to ensure sufficient signal quantities for the nodes in the sense latch circuit 41 to prevent it from miss sensing. The NMOS gate sensing circuit 48 comprises two NMOSFETs Q12 and Q13 connected to each other and is connected between the other node NS of the sense latch circuit 41 and the ground potential. The gate of the NMOSFET Q12 is connected to the global bit line G-BL so as to be driven. The gate of the NMOSFET Q13 is connected to a signal line SENSE so as to be driven.

The single-end sensing system (NMOS gate sensing) for the Y access circuit is configured to connect the global bit line G-BL at the sense side to the gate of the NMOSFET Q12. The NMOSFET Q12 senses a global bit line G-BL voltage to drive the node NS of the sense latch circuit 41. The sense latch circuit 41 is then activated with a sufficient signal quantity ensured for the node NS in the sense latch circuit 41. This can provide almost the same capacity for the nodes NS and NR at both sides of the sense latch circuit 41 to prevent it from miss sensing.

The use of the single-end sensing system decreases the number of elements needed for the circuits per bit line. That is to say, the above-mentioned open bit sensing system based on the first presupposed technology for the present invention requires 20 elements. On the other hand, the single-end sensing system requires 17 elements to decrease three elements. The reason for it is to decrease five elements by halving circuits needed for controlling two global bit lines G-BL and to increase two elements by using the NMOS gate sensing system.

Figure 4:
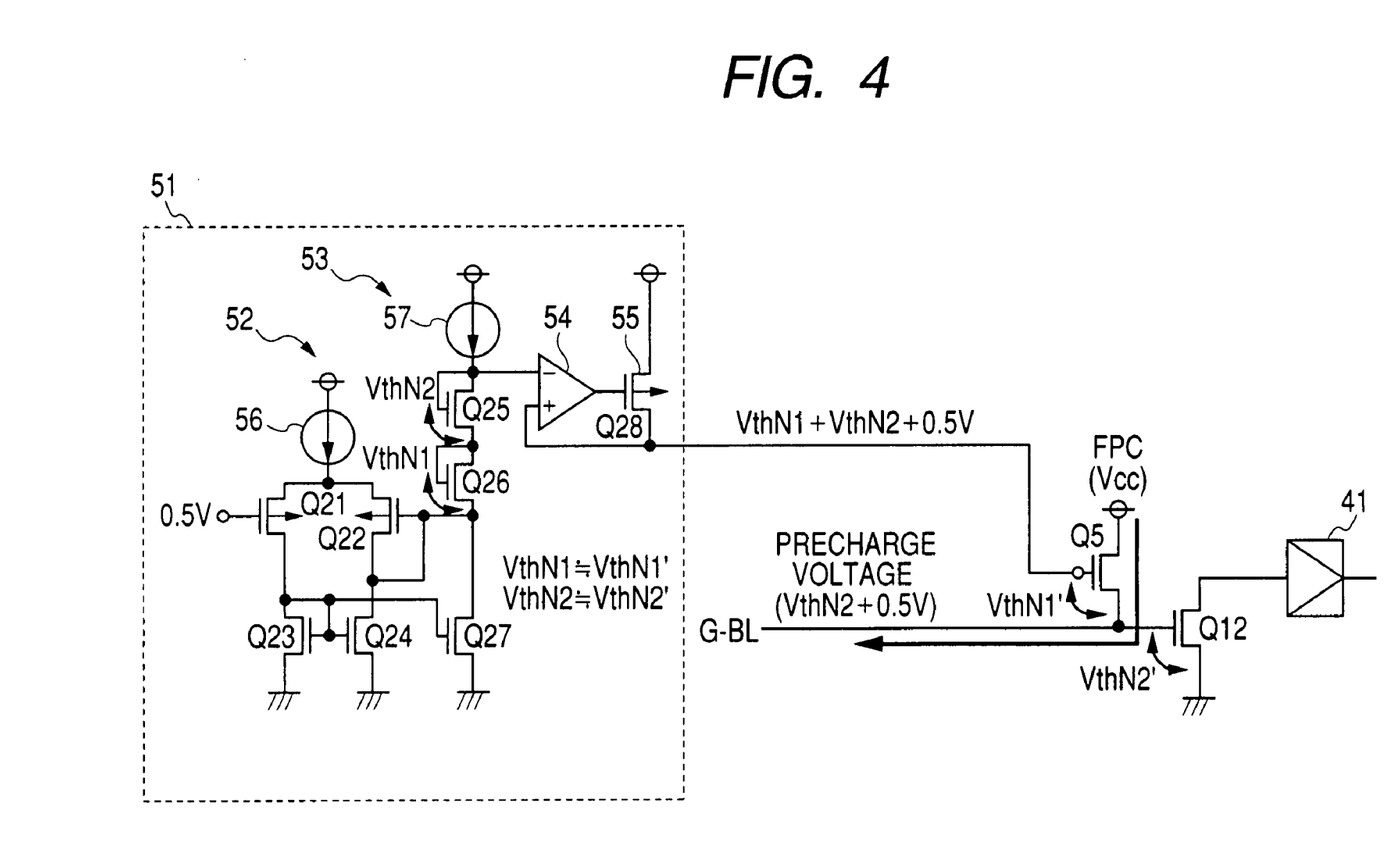
FIG. 4 is a circuit diagram showing a threshold voltage dependent power supply circuit.
Figure 5:
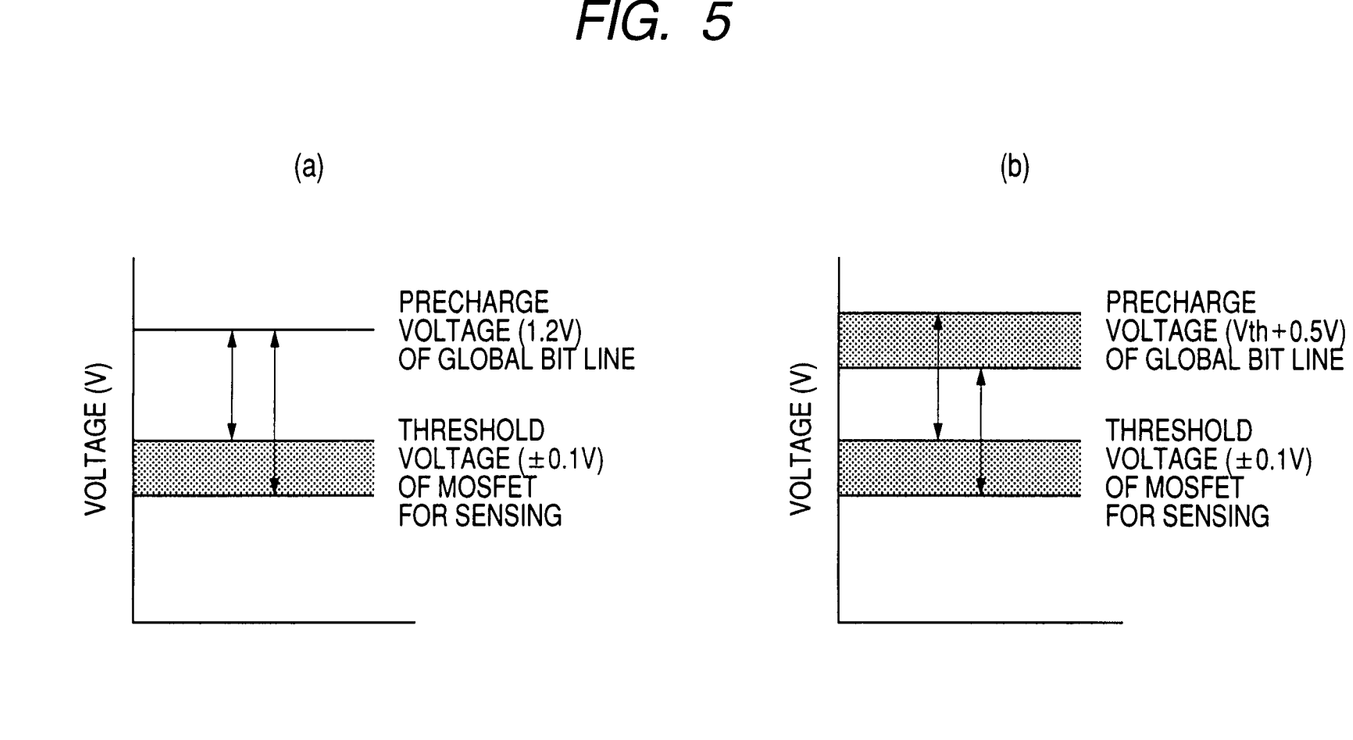

FIG. 4 shows an example of a value dependent power supply circuit in the NMOS gate sensing circuit. With reference to FIG. 5, the following describes the threshold voltage dependence by comparing case (a) with case (b). Case (a) concerns the second presupposed technology for the present invention not using the threshold voltage dependent power supply circuit in FIG. 4. Case (b) concerns the technology according to the present invention using the threshold voltage dependent power supply circuit.

According to the configuration of the threshold voltage dependent power supply circuit in FIG. 4, the NMOSFET Q12 of the NMOS gate sensing circuit 48 is connected to an NMOSFET Q5 of the global bit line precharge/discharge circuit 42. The gate of the NMOSFET Q5 is connected to a threshold voltage applying power supply 51. That is to say, the NMOSFET Q12 of the NMOS gate sensing circuit 48 is connected between the node NS of the sense latch circuit 41 and the ground potential. The gate is connected to the global bit line G-BL. The NMOSFET Q5 of the global bit line precharge/discharge circuit 42 is connected between the global bit line G-BL and the signal line FPC. The gate is connected to the threshold voltage applying power supply 51.

The threshold voltage applying power supply 51 comprises a differential amplifier 52, a threshold voltage supplementing circuit 53, an amplifier 54, and a driver 55. A predetermined voltage is applied to one input of the differential amplifier 52. The voltage passes through the threshold voltage supplementing circuit 53 and the amplifier 54 to reach the driver 55. The driver 55 outputs a predetermined voltage to the gate of the NMOSFET Q5 in the global bit line precharge/discharge circuit 42.

The differential amplifier 52 comprises a constant current source 56 and a differential circuit comprising two PMOSFETs Q21 and Q22 and two NMOSFETs Q23 and Q24. The constant current source 56 is connected to the power supply potential. The PMOSFETs Q21 and Q22 for higher potentials are connected to the constant current source 56. The NMOSFETs Q23 and Q24 for lower potentials are connected to the ground potential. A voltage is applied to the gate of the PMOSFET Q21.

The threshold voltage supplementing circuit 53 comprises a constant current source 57 and three vertically stacked NMOSFETs Q25 through Q27. The constant current source 57 is connected to the power potential. The NMOSFET Q25 for higher potentials is connected to the constant current source 57. The NMOSFET Q27 for lower potentials is connected to the ground potential. A connection node between the NMOSFET Q26 and the NMOSFET Q27 is connected to the gate of the PMOSFET Q22 in the differential amplifier 52. The gate of the NMOSFET Q27 is connected to the gate commonly connected to the NMOSFETs Q23 and Q24 in the differential amplifier 52.

A negative input terminal of the amplifier 54 is supplied with an output voltage from the threshold voltage supplementing circuit 53. A positive terminal is connected to an output voltage from the threshold voltage applying power supply 51. An output voltage from the amplifier 54 is input to the gate of the PMOSFET Q28 for the driver 55. The driver 55 outputs a threshold voltage dependent power.

In the threshold voltage applying power supply 51, for example, applying an approximate 0.5 V voltage to the gate of the PMOSFET Q21 in the differential amplifier 52 produces an approximate 0.5 V voltage at the gate of the PMOSFET Q22. Further, the approximate 0.5 V is supplemented by threshold voltage VthN1 of the NMOSFET Q26 and threshold voltage VthN2 of the NMOSFET Q25 in the threshold voltage supplementing circuit 53. The voltage is supplied to the amplifier 54 and the driver 55, and then is output from this driver 55 as a voltage of (VthN1+VthN2+0.5V).

Threshold voltage VthN2' of the NMOSFET Q12 in the NMOS gate sensing circuit 48 is set to approximately the same as threshold voltage VthN2 of the NMOSFET Q25 in the threshold voltage supplementing circuit 53. Further, threshold voltage VthN1' of the NMOSFET Q5 in the global bit line precharge/discharge circuit 42 is set to approximately the same as threshold voltage VthN1 of the NMOSFET Q26 in the threshold voltage supplementing circuit 53. Threshold voltage differences can be removed to always supply the global bit line G-BL with a constant precharge voltage (VthN2+0.5 V). The threshold voltages need to maintain the relation of VthN1≈VthN1' between the NMOSFET Q26 and the NMOSFET Q5 and between the NMOSFET Q25 and the NMOSFET Q12. This is made possible by taking the same NMOSFET size, especially the same gate size into design considerations.

FIG. 5 shows a comparison between cases where the above-mentioned threshold voltage dependent power supply circuit is used or not. FIG. 5(a) shows independence of Vth voltages when the threshold voltage dependent power supply circuit is not used. FIG. 5(b) shows dependence on Vth voltages when the threshold voltage dependent power supply circuit is used.

An example here shows a variation of ±0.1 V in the threshold voltage Vth of the NMOSFET Q12 in the NMOS gate sensing circuit 48. The independence of Vth voltages in FIG. 5(a) causes, e.g., a 1.2 V precharge voltage on the global bit line G-BL. A potential difference in precharge voltages depends on the threshold voltage of the NMOSFET Q12, decreasing the sense margin. On the other hand, in the case of the dependence on Vth voltages in FIG. 5(b), increasing the threshold voltage of the NMOSFET Q12 increases a precharge voltage on the global bit line G-BL. By contrast, decreasing the threshold voltage of the NMOSFET Q12 decreases a precharge voltage on the global bit line G-BL. Accordingly, a precharge voltage of (Vth+0.5 V) is applied to the global bit line G-BL. It is possible to always keep a constant potential difference in precharge voltages independently of the threshold voltage for the NMOSFET Q12, thus ensuring the sense margin.

In terms of the threshold voltage dependence, a sense point based on the NMOS gate sensing system is set to the threshold voltage of the NMOSFET Q12. It is necessary to always keep a constant difference between the precharge voltage on the global bit line G-BL and the threshold voltage. As mentioned above, the second presupposed technology for the present invention causes the threshold voltage to fluctuate and become indefinite due to process variations, which decreases the sense margin. To solve this problem, the present invention uses a voltage supplied with the threshold voltage dependence. This makes it possible to keep a voltage difference constant even when the threshold voltage fluctuates.

Figure 6:
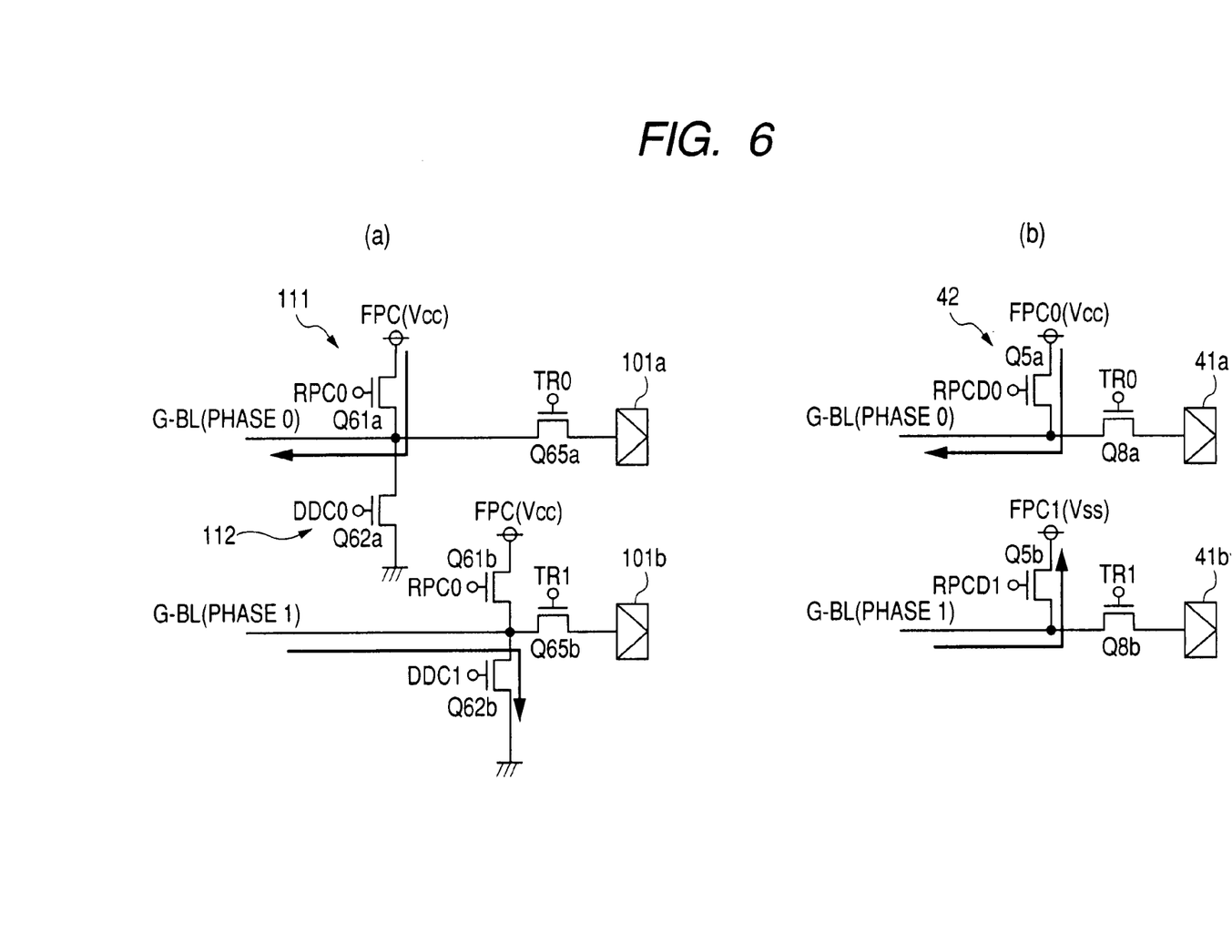

The following describes removal of the global bit line discharge circuit with reference to FIGS. 6(a) and 6(b) for comparison. FIG. 6(a) shows the first presupposed technology for the present invention to independently provide a global bit line precharge circuit and a global bit line discharge circuit. FIG. 6(b) shows the technology according to the present invention using a global bit line precharge/discharge circuit for both circuits.

There are two elements of a precharge circuit 111 and a discharge circuit 112 in the open bit sensing system according to the first presupposed technology for the present invention in FIG. 6(a). This is because a precharge operation for the global bit line G-BL takes place in two phases in order to decrease an adjacent interference.

At phase 0, for example, a signal on a signal line RPC0 turns on a MOSFET Q61a. The signal line FPC is supplied with a Vcc potential to precharge the global bit line G-BL. At this time, the system turns off a MOSFET Q62a which is driven by a signal on a signal line DDC0. During the precharge at phase 0, a signal on a signal line DDC1 turns on a MOSFET Q62b at phase 1. The global bit line G-BL is fixed to a Vss potential to function as a shield. At this time, the system turns off a MOSFET Q61b which is driven by a signal on a signal line RPC1.

On the other hand, the global bit line precharge/discharge circuit 42 according to the present invention in FIG. 6(b) is configured as follows. The signal line FPC supplies a source voltage. A potential of the signal line FPC is split into FPC0 or FPC1 to output the independent potential Vcc or Vss for each phase. Removing the discharge circuit can decrease the number of elements from two to one. Of course, it is possible to maintain 2-phase operations based on phase 0 or 1 as mentioned above for precharge and discharge operations on the global bit line G-BL.

At phase 0, for example, a signal on a signal line RPCD0 turns on a MOSFET Q5a. The signal line FPC0 is supplied with a Vcc potential to precharge the global bit line G-BL. During the precharge at phase 0, a signal on a signal line RPCD1 turns on a MOSFETQ5b at phase 1. A signal line FPC1 is supplied with a Vss potential to discharge the global bit line G-BL to the Vss potential. In this manner, the global bit line G-BL can function as a shield.

Figure 7:
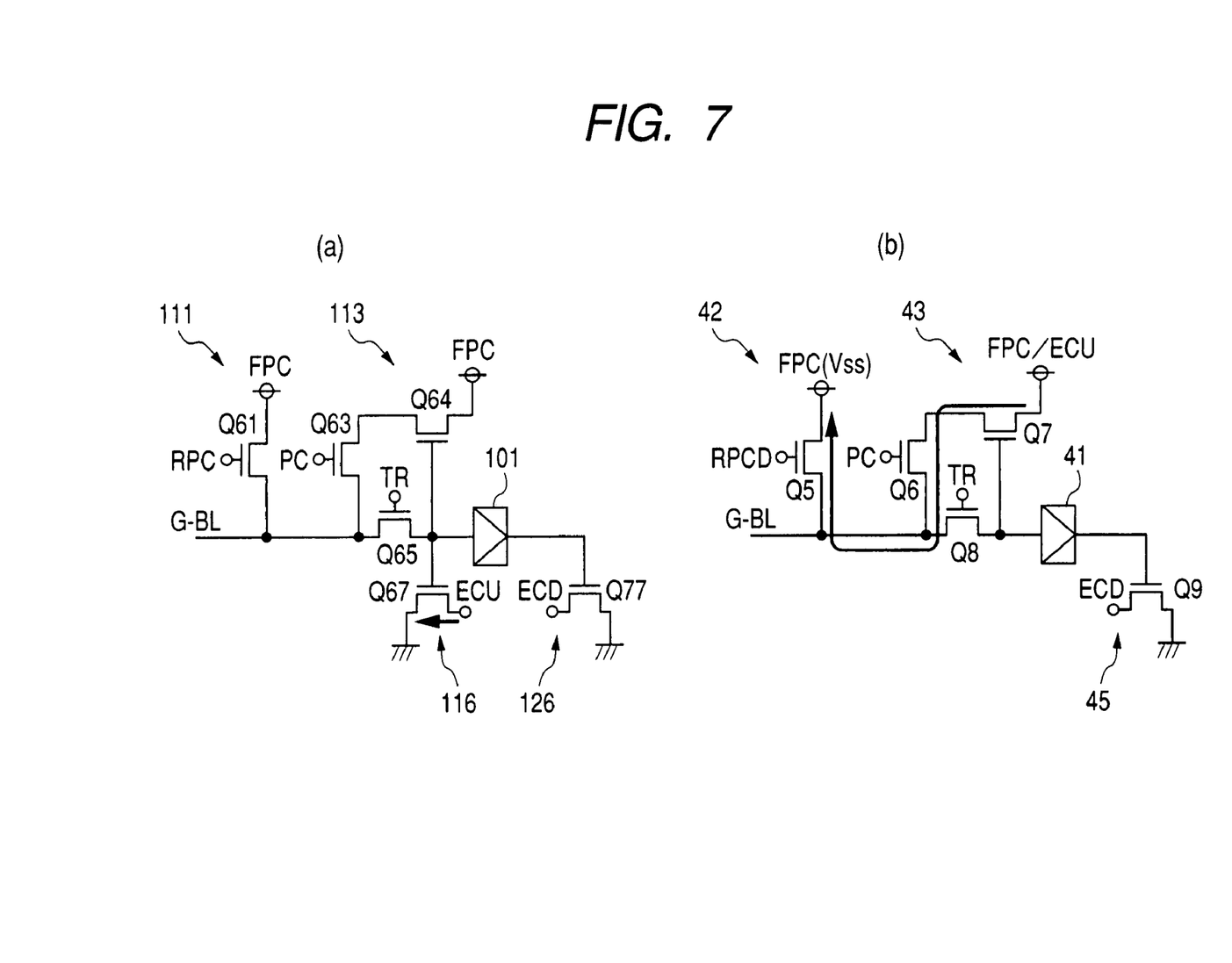

The following describes removal of the all-determination circuit with reference to FIGS. 7(a) and 7(b) for comparison. FIG. 7(a) shows the first presupposed technology for the present invention to separately provide all-determination circuits at both sides of the sense latch circuit. FIG. 7(b) shows the technology according to the present invention in which the all-determination circuit is provided only at one side of the sense latch circuit and the global bit line selection precharge/all-determination circuit is used for two circuits at the other side thereof.

In the open bit sensing system based on the first presupposed technology for the present invention in FIG. 7(a), all-determination circuits 116 and 126 are separately provided at both sides of the sense latch circuit 101. Since the all-determination circuits 116 and 126 independently determine latch data in the sense latch circuit 101, two elements are needed.

On the contrary, the technology according to the present invention in FIG. 7(b) replaces the all-determination circuit function at one side of the sense latch circuit 41 with the global bit line selection precharge/all-determination circuit 43 and the global bit line precharge/discharge circuit 42. This can decrease the number of elements from two to one. Of course, all-determination operations of the removed all-determination circuit are still available as follows. The signal line FPC or ECU supplies a source voltage to the global bit line selection precharge/all-determination circuit 43. A potential of the signal line FPC or ECU is split to output an ECU potential during an all-determination operation.

During an all-determination operation, a signal on the signal line PC turns on the NMOSFET Q6. A signal on the signal line RPCD turns on the NMOSFET Q5. The signal line FPC for the NMOSFET Q5 is set to a Vss potential. The signal line FPC/ECU for the NMOSFET Q7 is set to an ECU potential. In this manner, it is possible to determine voltage level "H" or "L" at a node for the sense latch circuit 41 to which the gate of the NMOSFET Q7 is connected.

For selective precharge, a signal on the signal line PC turns on the NMOSFET Q6. The signal line FPC/ECU for the NMOSFET Q7 is set to the Vcc potential. When the node for the sense latch circuit 41 is set to voltage level "H", it is possible to selectively precharge the global bit line G-BL.

Figure 8:
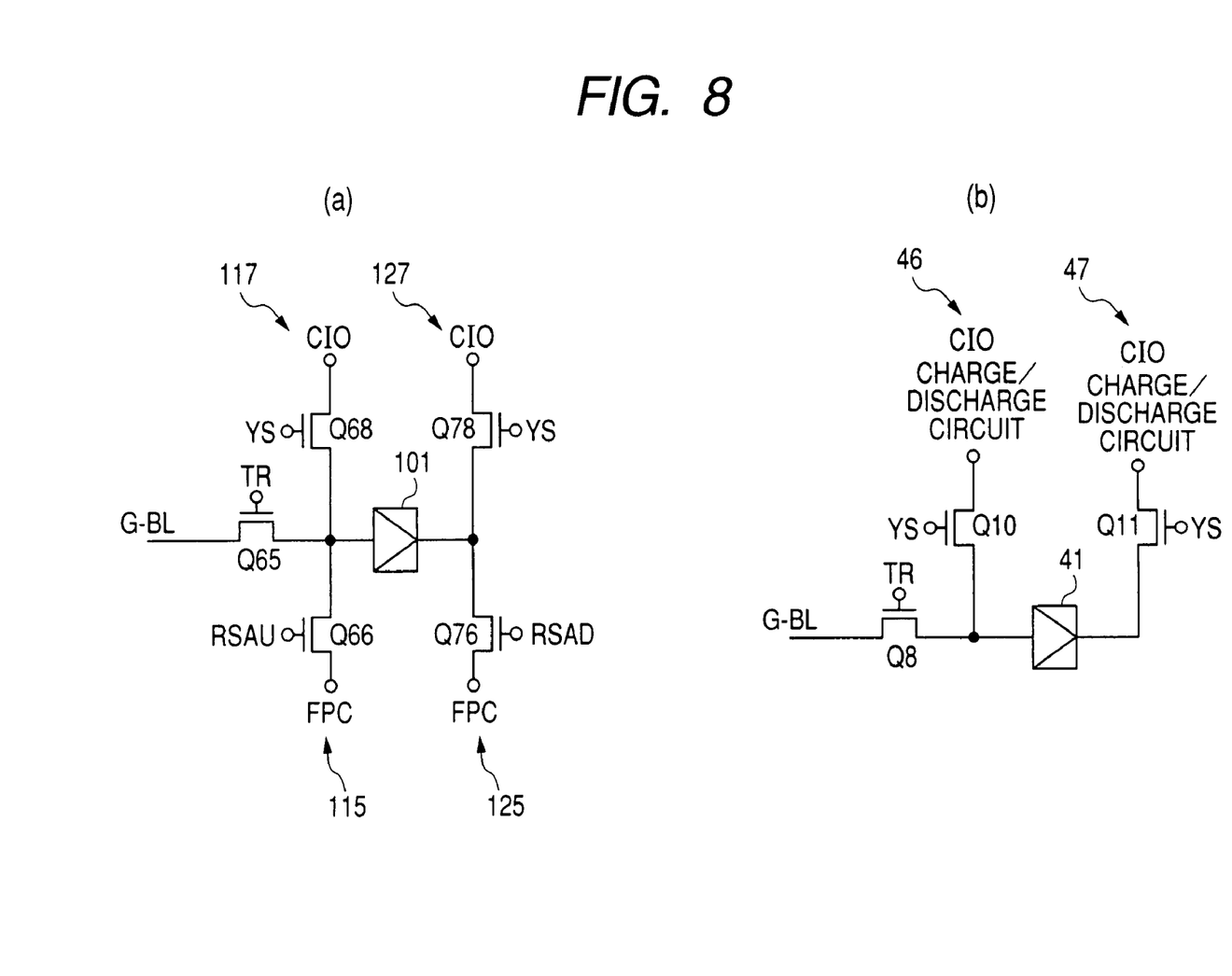

The following describes removal of the sense latch node control circuit with reference to FIGS. 8(a) and 8(b) for comparison. FIG. 8(a) shows the first presupposed technology for the present invention to provide the sense latch node control circuit. FIG. 8(b) shows the technology according to the present invention to replace the sense latch node control circuit with the Y-selection switch/sense latch node control circuit.

In the open bit sensing system based on the first presupposed technology for the present invention in FIG. 8(a), sense latch node control circuits 115 and 125 are provided at both sides of the sense latch circuit 101. Since the sense latch node control circuits 115 and 125 charge or discharge the node for the sense latch circuit 101, two elements are needed.

On the contrary, the technology according to the present invention in FIG. 8(b) uses the Y-selection switch/sense latch node control circuits 46 and 47 to provide the sense latch node control circuit function. This can eliminate two elements. Of course, the charge/discharge function of the removed sense latch node control circuit is likewise available by replacing the charge/discharge function with the common input/output line CIO for the Y-selection switch/sense latch node control circuits 46 and 47.

During a precharge, for example, a signal on the signal line YS turns on the NMOSFETs Q10 and Q11. Setting the common input/output line CIO to the Vcc potential can charge the node for the sense latch circuit 41. During a discharge, a signal on the signal line YS turns on the NMOSFETs Q10 and Q11. Setting the common input/output line CIO to the Vss potential can discharge the node for the sense latch circuit 41.

For Y selection, a signal on the signal line YS turns on the NMOSFETs Q10 and Q11. Data can be input and output between the sense latch circuit 41 and the common input/output line CIO.

Accordingly, the flash memory according to the embodiment can provide the following effects.

(1) The flash memory adopts the single-end sensing system to drive the NMOS gate sensing MOSFET by using a threshold voltage dependent voltage. In this manner, the flash memory can not only prevent sense operations from miss sensing in the sense latch circuit 41, but also ensure a range of sense operations comparable to the open bit sensing system based on the first presupposed technology for the present invention. This is summarized to the following two points: [1] sensing a sense voltage using the NMOSFET Q12 to ensure a sufficient signal quantity and activating the sense latch circuit 41; and [2] precharging the global bit line G-BL using an output voltage from the threshold voltage applying power supply 51 and always keeping a constant difference between a precharge voltage and the threshold voltage for the NMOSFET Q12 for sensing.

(2) The flash memory adopts the single-end sensing system and the NMOS gate sensing system that operates on a threshold voltage dependent voltage. Thus, it is possible to decrease the number of elements from 20 to 17 needed for the circuits in the Y access circuit compared to the open bit sensing system based on the first presupposed technology for the present invention.

(3) It is possible to reduce 17 elements to 13 elements per bit line by removing the global bit line discharge circuit 112 (122), the all-determination circuit 116, and the sense latch node control circuit 115 (125) from the open bit sensing system according to the first presupposed technology for the present invention.

(4) The flash memory is available as a 1-Gbit multivalued flash memory using the AG-AND memory array configuration to be shipped as flash memory products. Such product contains 32k Y access circuits per bit as mentioned above. Reducing 20 elements to 13 elements can decrease 224k elements per product. This is equivalent to approximately 5% reduction of the chip area.

(5) Even when the Y access circuit configuration is changed, it is possible to ensure the sense margin comparable to the presupposed technology for the present invention. Changing the sense circuit configuration can decrease the number of elements in the sense circuit and the other control circuits. This makes it possible to reduce the areas of not only the Y access circuit, but also the flash memory.

While there have been described specific preferred embodiments of the present invention made by the inventors, it is to be distinctly understood that the present invention is not limited thereto but may be otherwise variously embodied within the spirit and scope of the invention.

As mentioned above, the semiconductor storage unit according to the present invention is especially useful for the flash memory using two systems together. That is to say, one is the single-end sensing system to provide the sense latch circuit at one end of the bit line and detect voltages on the bit line corresponding to a threshold voltage for the memory cell using the sense latch circuit. The other is the NMOS gate sensing system to receive a sense voltage at the MOSFET gate and drive the node for the sense latch circuit. Further, the semiconductor storage unit can be widely applied to nonvolatile semiconductor storage units using the single-end sensing system, semiconductor units using the flash memory, semiconductor memory cards, semiconductor memory modules, and the like.

What is claimed is:

1. A nonvolatile semiconductor storage unit comprising:
   a plurality of word lines;
   a plurality of memory cells connected to a bit line, each memory cell being connected to a corresponding one of said word lines and having a control gate and a floating gate;
   a sense latch circuit having a first node and a second node, wherein said first node is connected to one end of said bit line, said sense latch circuit detecting data on said bit line corresponding to a threshold voltage of a selected memory cell;
   a MOSFET connected between said bit line and said sense latch circuit said MOSFET having a gate coupled to receive said data on said bit line, and said MOSFET driving said second node of said sense latch circuit;
   a bit line precharge circuit which is connected to said bit line and which precharges said bit line; and
   a power supply circuit which is connected to said bit line precharge circuit and which generates precharge voltage for said bit line according to a threshold voltage of said MOSFET.

2. The nonvolatile semiconductor storage unit according to claim 1,
   wherein said bit line precharge circuit can, supply first and second voltages having voltage levels different from each other and can further function to discharge said bit line,
   wherein said bit line precharge circuit is supplied with said first voltage when precharging said bit line, and wherein said bit line precharge circuit is supplied with said second voltage when discharging said bit line.

3. The nonvolatile semiconductor storage unit according to claim 2, further comprising:
   a bit line selective precharge circuit which is connected to said bit line and which selectively precharges said bit line,
   wherein said bit line selective precharge circuit can supply third and fourth voltages having different voltage levels from each other and determines data in said sense latch circuit in cooperation with said bit line precharge circuit,
   wherein, when selectively precharging said bit line, said bit line selective precharge circuit is supplied with said third voltage, and
   wherein, when determining data in said sense latch circuit, said bit line selective precharge circuit is supplied with said fourth voltage and said bit line precharge circuit is supplied with said second voltage.

4. The nonvolatile semiconductor storage unit according to claim 1, further comprising:
   a selection circuit which is connected to one of said first and second nodes of said sense latch circuit and which inputs/outputs data between said sense latch circuit and a common input/output line,
   wherein said selection circuit can supply fifth and sixth voltages having different voltage levels from each other and precharges and discharges said one of said first and second nodes,
   wherein said selection circuit makes connection between said sense latch circuit and said common input/output line when inputting/outputting data therebetween,
   wherein said selection circuit is supplied with said fifth voltage when said one of said first and second nodes is precharged, and
   wherein said selection circuit is supplied with said sixth voltage when said one of said first and second nodes is discharged.

5. The nonvolatile semiconductor storage unit according to claim 1,
   wherein sources of said plurality of memory cells are commonly connected to a common line via a second MOSFET driven by a gate control signal, and
   wherein a gate of each memory cell is connected to the corresponding word line and a drain thereof is commonly connected to said bit line.

6. The nonvolatile semiconductor storage unit according to claim 1,
   wherein each of said plurality of memory cells can store a plurality of bits of data as a threshold voltage.

7. The nonvolatile semiconductor storage unit according to claim 2,
   wherein sources of said plurality of memory cells are commonly connected to a common line via a second MOSFET driven by a gate control signal, and
   wherein a gate of each memory cell is connected to the corresponding word line and a drain thereof is commonly connected to said bit line.

8. The nonvolatile semiconductor storage unit according to claim 3,
   wherein sources of said plurality of memory cells are commonly connected to a common line via a second MOSFET driven by a gate control signal, and
   wherein a gate of each memory cell is connected to the corresponding word line and a drain thereof is commonly connected to said bit line.

9. The nonvolatile semiconductor storage unit according to claim 4,
wherein sources of said plurality of memory cells are commonly connected to a common line via a second MOSFET driven by a gate control signal, and
wherein a gate of each memory cell is connected to the corresponding word line and a drain thereof is commonly connected to said bit line.

10. The nonvolatile semiconductor storage unit according to claim 2,
wherein each of said plurality of memory cells can store a plurality of bits of data as a threshold voltage.

11. The nonvolatile semiconductor storage unit according to claim 3,
wherein each of said plurality of memory cells can store a plurality of bits of data as a threshold voltage.

12. The nonvolatile semiconductor storage unit according to claim 4,
wherein each of said plurality of memory cells can store a plurality of bits of data as a threshold voltage.

13. A nonvolatile semiconductor storage unit, comprising:
a nonvolatile memory cell capable of storing data as a threshold voltage thereof;
a bit line coupled to said nonvolatile memory cell;
a first MOSFET having a gate terminal, thereof coupled to said bit line, a first terminal and a second terminal;
a second MOSFET having a source-drain path coupled to said bit line;
a sense amplifier having a first node thereof coupled to said first terminal of said first MOSFET and a second node thereof coupled to said source-drain path of said second MOSFET, and sensing a voltage level of said bit line;
a precharge circuit to supply a precharge voltage to said bit line in response to reading data stored in said nonvolatile memory cell; and
a precharge control circuit to supply a control signal to said precharge circuit,
wherein said precharge control circuit is adapted to control said precharge control signal, which is used for supplying said precharge voltage to said bit line in accordance with variations of a threshold voltage of said first MOSFET when supplying said precharge voltage to said bit line before said sensing.

* * * * *